US012798174B2

(12) United States Patent
Okada et al.

(10) Patent No.: US 12,798,174 B2
(45) Date of Patent: Nov. 17, 2026

(54) IMPRINT APPARATUS, IMPRINT METHOD AND ARTICLE MANUFACTURING METHOD

(71) Applicant: CANON KABUSHIKI KAISHA, Tokyo (JP)

(72) Inventors: Tetsuji Okada, Saitama (JP); Toshihiro Ifuku, Tochigi (JP); Hisanobu Azuma, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 184 days.

(21) Appl. No.: 18/609,046

(22) Filed: Mar. 19, 2024

(65) Prior Publication Data

US 2024/0326316 A1 Oct. 3, 2024

(30) Foreign Application Priority Data

Mar. 30, 2023 (JP) ................................ 2023-056354

(51) Int. Cl.
*B29C 59/02* (2006.01)
*B08B 7/00* (2006.01)
*B29C 59/00* (2006.01)
*G03F 7/00* (2006.01)

(52) U.S. Cl.
CPC ............ *B29C 59/02* (2013.01); *B08B 7/0014* (2013.01); *B29C 59/002* (2013.01); *G03F 7/0002* (2013.01)

(58) Field of Classification Search
CPC ..... B29C 59/02; B29C 59/002; G03F 7/0002; B08B 7/0014
See application file for complete search history.

(56) References Cited

U.S. PATENT DOCUMENTS

| | | | | |
|---|---|---|---|---|
| 5,934,566 A | | 8/1999 | Kanno et al. | |
| 2005/0042958 A1* | | 2/2005 | Namikawa .......... | G03F 7/70925 442/64 |
| 2010/0320631 A1* | | 12/2010 | Suzuki .................. | B82Y 10/00 425/169 |
| 2015/0004790 A1* | | 1/2015 | Murayama ............. | B29C 33/62 430/5 |

(Continued)

FOREIGN PATENT DOCUMENTS

| | | | |
|---|---|---|---|
| JP | H02206114 A | * | 8/1990 |
| JP | H0774137 A | | 3/1995 |

(Continued)

*Primary Examiner* — Jerzi H Moreno Hernandez
(74) *Attorney, Agent, or Firm* — ROSSI, KIMMS & McDOWELL LLP

(57) ABSTRACT

An imprint apparatus including a substrate stage configured to hold a substrate, a separating unit configured to perform separation processing of separating a removal film from the substrate held on the substrate stage, a processing unit including a dispenser configured to supply an imprint material on an organic film from which the removal film is separated and a mechanism configured to adjust an interval between a mold and the substrate to which the imprint material is supplied, and configured to perform an imprint processing, and a chamber configured to accommodate the substrate stage, the separating unit, and the processing unit, wherein the separating unit and the processing unit respectively perform the separation processing and the imprint processing in the chamber.

6 Claims, 6 Drawing Sheets

(56) References Cited

U.S. PATENT DOCUMENTS

2017/0368726 A1* 12/2017 Shudo .................... B29C 43/58

FOREIGN PATENT DOCUMENTS

| | | | |
|---|---|---|---|
| JP | H08318181 | A | 12/1996 |
| JP | 2007258462 | A | 10/2007 |
| KR | 20090128473 | A | 12/2009 |
| KR | 20100018458 | A | 2/2010 |
| KR | 20170054455 | A | 5/2017 |

* cited by examiner

IMPRINT APPARATUS, IMPRINT METHOD AND ARTICLE MANUFACTURING METHOD

BACKGROUND OF THE INVENTION

Field of the Invention

The present invention relates to an imprint apparatus, an imprint method and an article manufacturing method.

Description of the Related Art

There is a growing demand for the miniaturization of semiconductor devices and micro electro mechanical systems (MEMS). Accordingly, much attention has been paid to imprint technology in addition to conventional photolithography technology. The imprint technology is microfabrication technology for forming the pattern of an imprint material arranged (supplied) on a substrate which corresponds to the pattern of a mold onto a substrate by curing the imprint material while the imprint material is in contact with the mold. The imprint technology can form a fine structure on the order of several nanometers on a substrate.

In an imprint apparatus using the imprint technology, when an imprint material on a substrate is brought into contact with a mold while a foreign substance adheres to (exists on) the substrate, the pattern (structure) of the imprint material cannot be formed in a desired shape. In addition, contact between a foreign substance on a substrate and a mold may damage the mold and the substrate. Accordingly, it is necessary to perform imprint processing of forming the pattern on the imprint material on the substrate by bringing the imprint material into contact with the mold after the foreign substance is removed by cleaning the substrate.

Techniques of removing foreign substances on substrates have been proposed in Japanese Patent Laid-Open Nos. 8-318181 and 2007-258462. Japanese Patent Laid-Open No. 8-318181 has disclosed a technique of removing a foreign substance on a substrate by using a physical force based on a hydrodynamic force. Japanese Patent Laid-Open No. 2007-258462 has disclosed a technique of removing a foreign substance on a substrate by a lift-off process by using an etching effect (chemical effect) with a chemical solution.

An imprint apparatus performs imprint processing for a substrate on which an organic layer is formed (applied). Accordingly, when an organic layer is formed after cleaning of a substrate, a foreign substance may adhere to the organic layer, and imprint processing may be performed while the foreign substance exists on the substrate. It is therefore preferable to clean the substrate on which the organic layer is formed immediately before imprint processing.

However, according to conventional techniques of removing foreign substances by using a physical force, in order to remove a foreign substance having a small particle size, the physical force needs to be increased. In this case, the organic layer formed on the substrate may be damaged. In addition, in a conventional technique using the chemical effect of a chemical solution, damage may occur in the organic layer formed on the substrate.

SUMMARY OF THE INVENTION

The present invention provides an imprint apparatus advantageous in removing a foreign substance on a substrate.

According to one aspect of the present invention, there is provided an imprint apparatus that performs, by using a mold, imprint processing of forming a pattern on an imprint material on a substrate on which a removal film for removing an organic film and a foreign substance is formed, the apparatus including a substrate stage configured to hold the substrate, a separating unit configured to perform separation processing of separating the removal film from the substrate held on the substrate stage, a processing unit including a dispenser configured to supply the imprint material on the organic film from which the removal film is separated and a mechanism configured to adjust an interval between the mold and the substrate to which the imprint material is supplied, and configured to perform the imprint processing, and a chamber configured to accommodate the substrate stage, the separating unit, and the processing unit, wherein the separating unit and the processing unit respectively perform the separation processing and the imprint processing in the chamber.

Further aspects of the present invention will become apparent from the following description of exemplary embodiments with reference to the attached drawings.

DESCRIPTION OF THE EMBODIMENTS

Figure 1:
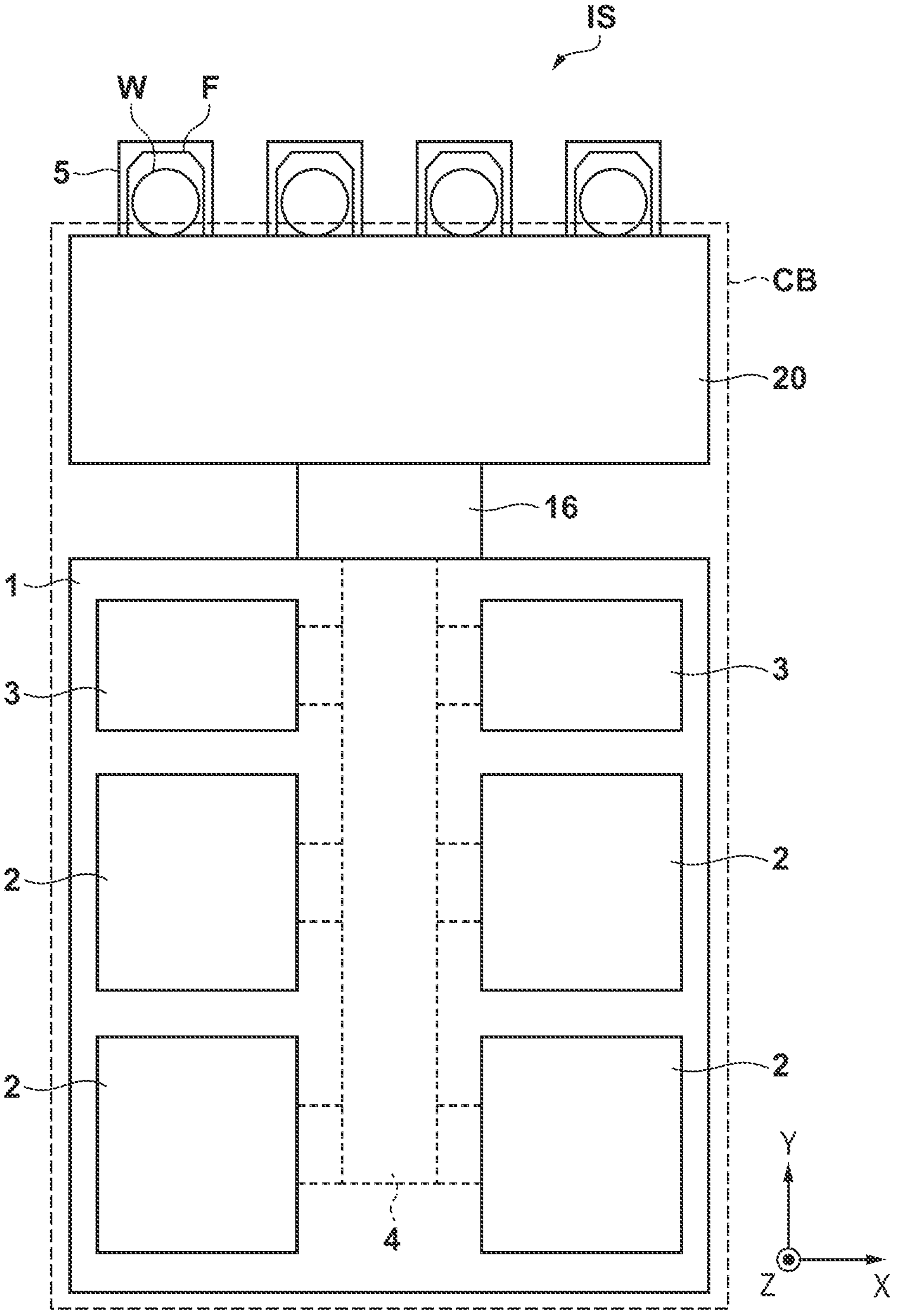
FIG. 1 is a schematic view illustrating configurations of an imprint system including an imprint apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic view illustrating the configurations of an imprint system IS including an imprint apparatus 1 according to an aspect of the present invention. The imprint system IS includes the imprint apparatus 1, a mounting base 5, a connecting apparatus 16, and a forming apparatus 20.

The imprint apparatus 1 is a lithography apparatus employed in a lithography step that is a manufacturing step for a device such as a semiconductor element, a liquid crystal display element, or magnetic storage medium as an article to form a pattern on a substrate. The imprint apparatus 1 brings an uncured imprint material arranged (supplied) on the substrate into contact with the mold, and applies curing energy to the imprint material, thereby forming a pattern of a cured product to which the pattern of the mold is transferred.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

In the specification and the accompanying drawings, directions will be indicated on an XYZ coordinate system in which directions parallel to a plane on which the substrate is placed are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively.

As shown in FIG. 1, the imprint apparatus 1 includes a processing unit 2, a separating unit 3, and a conveying unit 4. Referring to FIG. 1, this apparatus includes a plurality of processing units 2 and a plurality of separating units 3. This is not exhaustive. It suffices to include at least one each of the processing unit 2 and the separating unit 3.

The processing unit 2 is a unit for performing imprint processing of forming the pattern on an imprint material on a substrate by using a mold. The separating unit 3 is a unit for performing separation processing of separating an adjustment film and a removal film formed on a substrate by using the forming apparatus 20 (to be described later). The conveying unit 4 conveys a substrate W in the imprint apparatus, specifically between the processing unit 2, the separating unit 3, and the connecting apparatus 16.

The mounting base 5 is a base on which a storage case F storing the substrate W is mounted. This base stores and manages the substrates W stored in the storage case F. The connecting apparatus 16 in-line connects the imprint apparatus 1 and the forming apparatus 20 to convey the substrate W between the imprint apparatus 1 and the forming apparatus 20. The substrate W is loaded and unloaded to and from the forming apparatus 20 through the storage case F mounted on the mounting base 5.

The forming apparatus 20 functions as a forming unit for performing the processing of forming various types of films on a substrate, specifically in this embodiment, the processing of forming an organic film, an adjustment film, and a removal film on a substrate. In the embodiment, the forming apparatus 20 is configured independently of the imprint apparatus 1 but may be configured as an element of the imprint apparatus 1 (that is, a part of the imprint apparatus 1). The organic film, the adjustment film, and the removal film formed on the substrate will be described later.

In this embodiment, in the imprint system IS, the forming apparatus 20 including a conveyance path for the substrate W, the connecting apparatus 16, and the imprint apparatus 1, especially the processing unit 2, the separating unit 3, and the conveying unit 4 of the imprint apparatus 1 are accommodated in a chamber CB. The internal space of the chamber CB accommodating them, that is, the inside of the chamber, is maintained (environmentally controlled) at a high cleanliness, for example, at a cleanliness of class 2 or more. Accordingly, an imprint system IM (the imprint apparatus 1) is configured to reduce the possibility of the adhesion of a foreign substance on the substrate W and suppress a foreign substance from adhering to the substrate W while the substrate W is conveyed or processed.

Figure 2:
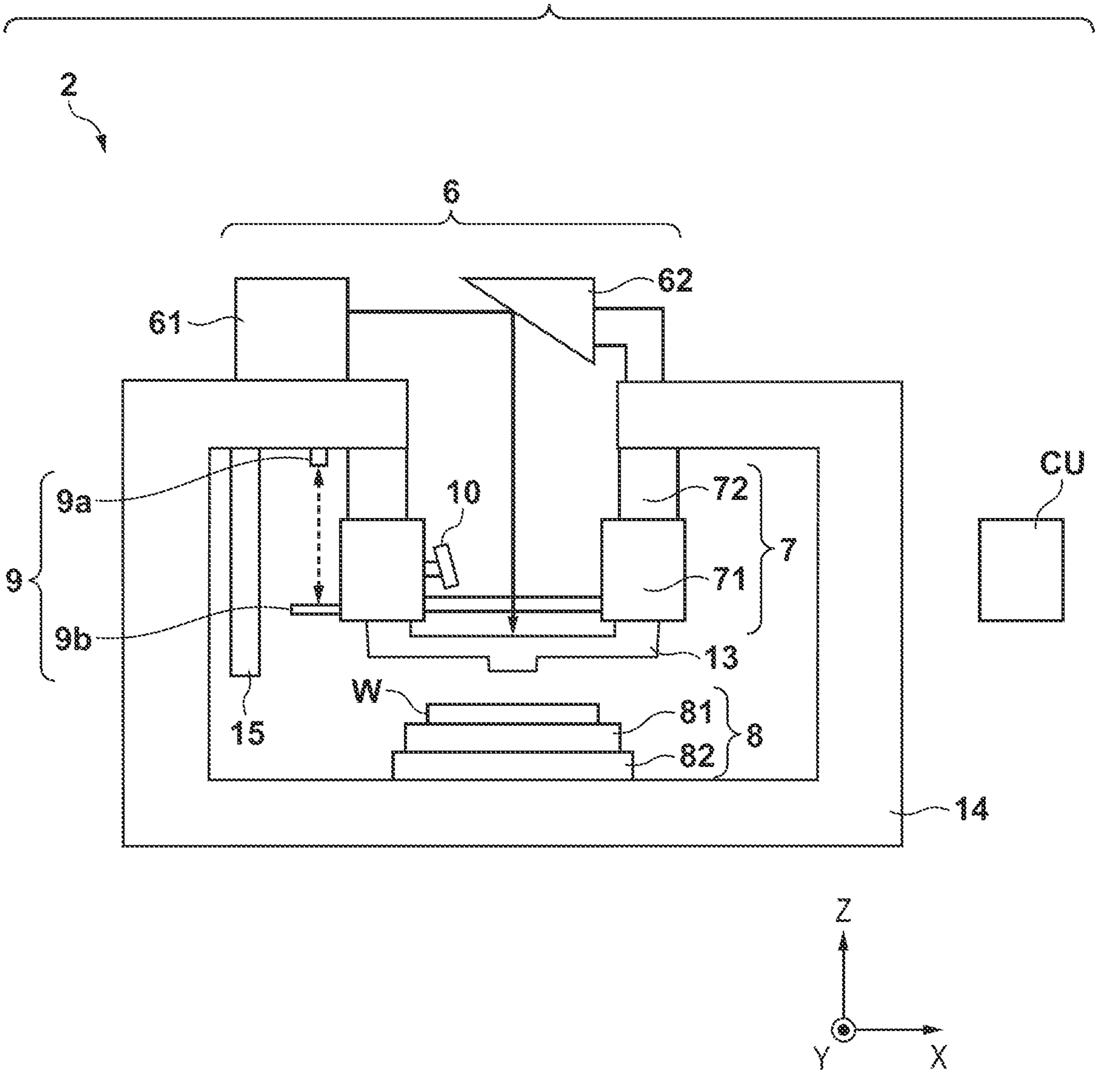
FIG. 2 is a schematic view illustrating the configurations of the processing unit of the imprint apparatus.

The details of the processing unit 2 of the imprint apparatus 1 will be described with reference to FIG. 2. FIG. 2 is a schematic view showing the configurations of the processing unit 2 of the imprint apparatus 1. In this embodiment, the processing unit 2 uses a photo-curing method of curing an imprint material by irradiating the material with light such as ultraviolet light as an imprint material curing method. However, this is not exhaustive. For example, the processing unit 2 can use a thermal curing method of curing an imprint material by heating the material as an imprint material curing method. The processing unit 2 includes an irradiation unit 6, a mold stage 7, a substrate stage 8, a distance measuring unit 9, an alignment optical system 10, a dispenser 15, and a control unit CU.

The irradiation unit 6 includes a light source unit 61 that emits light to cure an imprint material on a substrate and an optical system 62 for guiding light emitted from the light source unit 61 to the imprint material on the substrate and irradiates the imprint material on the substrate with light through a mold 13. The optical system 62 includes an optical element and an optical member which are used to adjust light emitted from the light source unit 61 to light proper for imprint processing.

The mold stage 7 includes a mold holding unit 71 that holds the mold 13 with a vacuum suction force or electrostatic force and a mold driving unit 72 that changes (controls) the position and the posture of the mold holding unit 71 (the mold 13 held by the mold holding unit 71) by driving the mold holding unit 71. The mold holding unit 71 and the mold driving unit 72 each have an opening in the central portion (inside) so as to irradiate an imprint material on a substrate with light from the irradiation unit 6. The mold driving unit 72 drives the mold holding unit 71 in the Z direction to bring the mold 13 into contact with the imprint material on the substrate or separate the mold 13 from the imprint material on the substrate.

The substrate stage 8 includes a substrate holding unit 81 that holds the substrate W and a substrate driving unit 82 that drives the substrate holding unit 81 (the substrate W held by the substrate holding unit 81) in the X direction and the Y direction. The substrate driving unit 82 may be configured from a plurality of driving systems such as a coarse driving system and a fine driving system, including a linear motor. The substrate driving unit 82 may have a function of driving the substrate holding unit 81 in the Z direction as well as in the X direction and the Y direction. The substrate driving unit 82 may have a tilt function for changing (controlling) the posture of the substrate holding unit 81.

The position of the substrate stage 8 is measured by an encoder system constituted by a scale provided on a housing 14 and a head (optical equipment) provided on the substrate driving unit 82. Note that the system for measuring the position of the substrate stage 8 is not limited to the encoder system and may be an interferometer system constituted by a laser interferometer provided on the housing 14 and a reflecting mirror provided on the substrate driving unit 82.

The mold stage 7 and the substrate stage 8 constitute a relative driving mechanism that drives at least one of the mold 13 and the substrate W so as to adjust the relative position between the mold 13 and the substrate W. The adjustment of the relative position between the mold 13 and the substrate W by the relative driving mechanism includes driving for bringing the mold 13 into contact with the imprint material on the substrate and driving for separating the mold 13 from the cured imprint material on the substrate. As described above, the mold stage 7 and the substrate stage 8 function as a mechanism that adjusts the interval between the mold 13 and the substrate W. In addition, the adjustment of the relative position between the mold 13 and the substrate W by the relative driving mechanism includes alignment between the mold 13 and the substrate W.

The distance measuring unit 9 has a function of measuring the distance between the mold 13 and the substrate W, that is, the interval between the mold 13 and the substrate W. The distance measuring unit 9 is configured by, for example, a laser interferometer including a measuring device 9*a* including a light-emitting unit and light-receiving unit and a reflecting mirror 9*b*. The distance measuring unit 9 obtains the posture of the mold 13 by measuring the interval between the mold 13 and the substrate W at a plurality of positions.

The alignment optical system 10 measures the positional shift (the relative position in the X direction and the Y direction) between the mold 13 and the substrate W by detecting the alignment mark provided on the mold 13 and the alignment mark provided on the substrate W. The position of the substrate stage 8 is controlled based on the positional shift measured by the alignment optical system 10 so as to make the positional shift fall within an allowable range.

The dispenser 15 has a function of supplying an imprint material on the substrate W (its shot region). The dispenser 15 arranges an imprint material on a substrate by discharging the imprint material (its droplets) in synchronism with the driving of the substrate W in a state in which the substrate W is driven by the substrate driving unit 82.

The control unit CU is configured by a computer (information processing apparatus) including a CPU and a memory and comprehensively controls the respective units of the imprint apparatus 1 in accordance with programs stored in a storage unit or the like. The control unit CU controls imprint processing of forming the pattern on an imprint material on a substrate by using the mold 13 by controlling the operation, adjustment, and the like of each unit of the imprint apparatus 1. In this embodiment, the control unit CU has a function of comprehensively controlling each apparatus of the imprint system IS. Note, however, that a controller that comprehensively controls each apparatus of the imprint system IS may be provided independently of the control unit CU.

In performing imprint processing (bringing the mold 13 into contact with the imprint material on the substrate), if there is a foreign substance on a substrate, the imprint apparatus 1 cannot form the pattern of the imprint material into a desired shape. In addition, bringing the foreign substance on the substrate into contact with the mold 13 can damage the mold 13 and the substrate W.

Accordingly, in this embodiment, a removal film for removing a foreign substance on the substrate W to be loaded from the storage case F mounted on the mounting base 5 into the forming apparatus 20 is formed, and the removal film is separated (removed) from the substrate W by the separating unit 3 immediately before imprint processing is performed. With this operation, in imprint processing, since the foreign substance has been removed from the substrate, the pattern of the imprint material can be formed in a desired shape, and it is possible to prevent damage on the mold 13 and the substrate W due to the foreign substance on the substrate.

Figure 3:
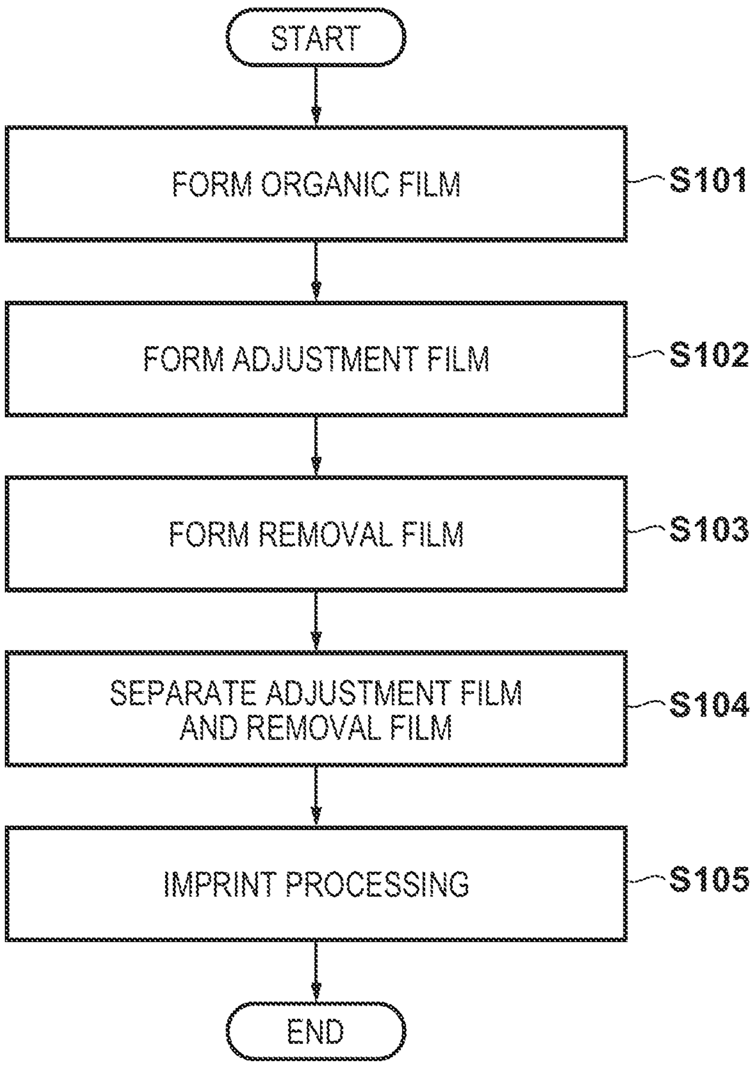
FIG. 3 is a flowchart for explaining the processing of forming the pattern of an imprint material on a substrate.

Processing in the imprint apparatus 1 (the imprint system IS), that is, the processing (imprint method) of forming the pattern on an imprint material on a substrate will be described below with reference to FIGS. 3 and 4A to 4H. The control unit CU performs this processing by comprehensively controlling each apparatus of the imprint system IS and each unit of the imprint apparatus 1. FIG. 3 is a flowchart for explaining the processing of forming the pattern of an imprint material on a substrate. FIGS. 4A to 4H are views schematically showing a process of forming the pattern on an imprint material.

Figure 4A:
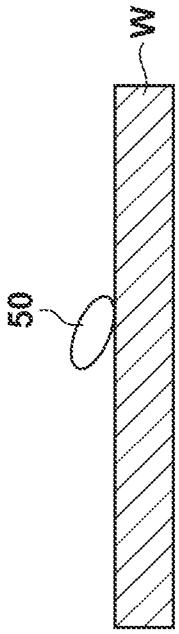
FIGS. 4A to 4H are views schematically showing a process of forming a pattern on an imprint material.

Referring to FIG. 4A, a foreign substance 50 sometimes adheres to the substrate W (its surface (surface to be processed)) on which the pattern of an imprint material is to be formed. The foreign substance 50 includes a foreign substance adhering to the substrate W in a preliminary step and a foreign substance that cannot be removed in a cleaning step (a step of cleaning the substrate W) included in the preceding step.

In step S101, an organic film 51 for imprint processing is formed on the substrate W (its surface). More specifically, the substrate W is taken out from the storage case F mounted on the mounting base 5 and loaded into the forming apparatus 20. The forming apparatus 20 then performs the processing of forming the organic film 51 on the substrate.

Figure 4B:
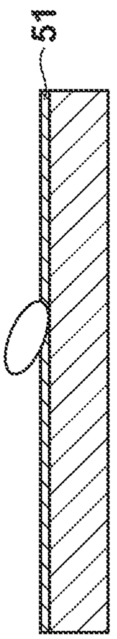

FIG. 4B shows the state of the substrate W after step S101, that is, the state in which the organic film 51 is formed on the substrate. As shown in FIG. 4B, if the thickness of the foreign substance 50 is larger than the thickness of the organic film 51 formed on the substrate, contract between the foreign substance 50 on the substrate and the mold 13 may cause defective formation of a pattern or damage on the mold 13 and the substrate W.

The organic film 51 is configured by an organic material used in a microfabrication process using an imprint technique and is implemented as an adhesion layer for imprint processing. In general, in imprint processing, when the mold 13 is to be brought into contact with an uncured imprint material on a substrate, an adhesion film for imprint processing is preferably formed as the organic film 51 on the substrate. Forming an adhesion film as the organic film 51 can improve the adhesiveness between the substrate W and the imprint material. An adhesion film for imprint processing is made of, for example, a material having a carboxyl group bonding to the substrate W or an acrylic group reacting with an imprint material. In addition, an adhesion film for imprint processing may contain, as other components, a cross-linker, a thermal polymerization initiator, a surfactant, and the like.

The forming apparatus 20 forms the organic film 51 on the substrate W by using a technique capable of film thickness control, such as an inkjet method, a dispenser method, a spin coat method, various types of printing methods such as screen printing, gravure printing, and offset printing, and a dipping method. In this embodiment, the forming apparatus 20 includes a spin coater and forms the organic film 51 by applying an organic material using a spin coat method and curing the organic material. When an organic material configuring the organic film 51 is to be cured by heating, the forming apparatus 20 includes a heater or an infrared lamp. When an organic material configuring the organic film 51 is to be cured by irradiation with ultraviolet light, the forming apparatus 20 includes an infrared lamp. When an organic material configuring the organic film 51 is to be cured by drying, the forming apparatus 20 includes a pump for increasing the pressure in a closed space.

Figure 4C:
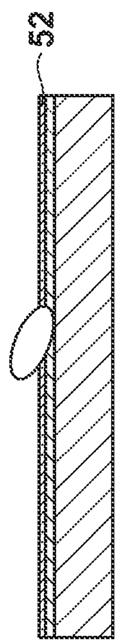

In step S102, an adjustment film 52 is formed on the organic film for imprint processing formed in step S101. More specifically, the forming apparatus 20 continues the processing of forming the organic film 51 and performs the processing of forming the adjustment film 52. FIG. 4C shows the state of the substrate W after step S102, that is, the state in which the adjustment film 52 is formed on the organic film. Forming the organic film 51 and the adjustment film 52 using the forming apparatus 20 (applying and curing the material) in this manner makes it possible to reduce the chance (possibility) of making a foreign substance adhere onto the organic film.

The adjustment film 52 has a function of adjusting the adhesive force between itself and the film formed on or under the adjustment film 52. In this embodiment, the adjustment film 52 is a film for adjusting the adhesive force between the adjustment film 52 and the organic film 51 to be smaller than the adhesive force between the adjustment film 52 and a removal film 53. In the process of separating (removing) the removal film 53 (step S104), this adjustment is performed to suppress the separation failure of the removal film 53 (for example, the remaining of the removal film 53 or the adjustment film 52).

The adjustment film 52 is made of a thermosetting resin. The adjustment film 52 contains, for example, a resin having a siloxane bond or an epoxy resin. In addition, the adjustment film 52 may contain a polar solvent that does not swell or dissolve the organic film 51 for imprint processing. This makes it possible to ensure the separability of the adjustment film 52.

In step S103, the removal film 53 is formed on the adjustment film formed in step S102. More specifically, the forming apparatus 20 performs the processing of forming the removal film 53 following the processing of forming the organic film 51 and the adjustment film 52. Forming the organic film 51, the adjustment film 52, and the removal film 53 using the same forming apparatus 20 in this manner can reduce the chance (possibility) of making a foreign substance adhere onto the adjustment film.

Figure 4D:
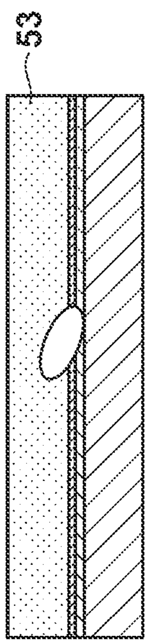

FIG. 4D shows the state of the substrate W after step S103, that is, the state in which the removal film 53 is formed on the adjustment film. As shown in FIG. 4D, the removal film 53 is preferably formed to have a sufficient thickness to enclose (cover) the foreign substance 50 on the substrate. Covering the adjustment film 52 with the removal film 53 will prevent a foreign substance different from the foreign substance 50 from directly adhering to the organic film 51 for imprint processing.

The removal film 53 is made of a thermosetting resin. The removal film 53 is made of, for example, a resin having a siloxane bond, an epoxy resin, an acrylic resin, or a phenol resin.

In step S104, the adjustment film 52 formed in step S102 and the removal film 53 formed in step S103 are separated (removed). More specifically, the substrate W on which the organic film 51, the adjustment film 52, and the removal film 53 are formed is loaded from the forming apparatus 20 into the imprint apparatus 1 through the connecting apparatus 16 and conveyed to the separating unit 3 by the conveying unit 4. Note that the substrate W is conveyed between the forming apparatus 20 and the imprint apparatus 1 while being held on the substrate stage 8 (substrate holding unit 81). In other words, the substrate stage 8 holding the substrate W is delivered and received between the forming apparatus 20 and the imprint apparatus 1. The separating unit 3 then performs the separation processing of separating both the removal film 53 and the adjustment film 52 from the substrate W held on the substrate stage 8. The detailed configurations of the separating unit 3 will be described later.

Figure 4E:
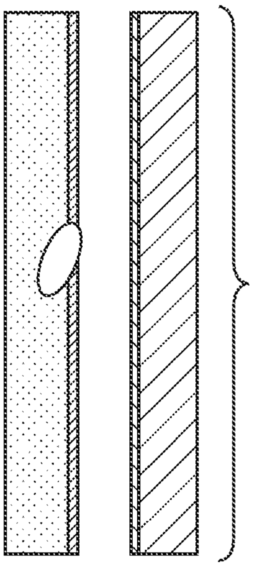

FIG. 4E shows the state of the substrate W after step S104, that is, the state in which the adjustment film 52 and the removal film 53 are separated from the substrate. As shown in FIG. 4E, the foreign substance 50 enclosed in the removal film 53 is separated and removed from the organic film 51 for imprint processing by separating the removal film 53.

In step S105, imprint processing is performed. More specifically, the conveying unit 4 conveys the substrate W, from which the adjustment film 52 and the removal film 53 are separated, from the separating unit 3 to the processing unit 2. The processing unit 2 then performs the imprint processing of forming the pattern on an imprint material 54 on the substrate.

Figure 4F:
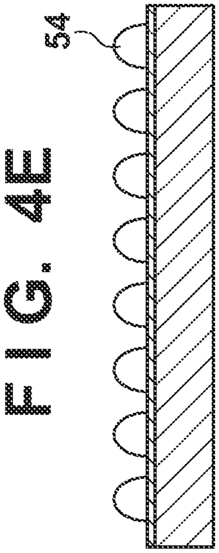
Figure 4G:
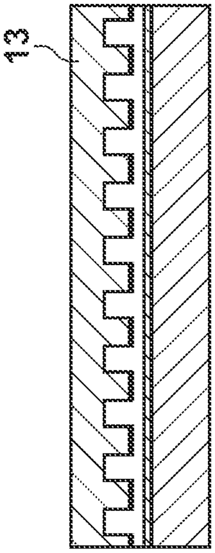
Figure 4H:
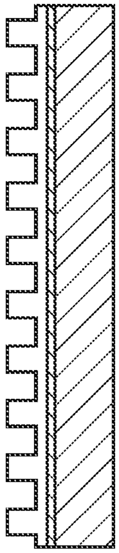

In the imprint processing, first of all, as shown in FIG. 4F, the imprint material 54 is supplied from the dispenser 15 to the substrate W, that is, the organic film formed on the substrate W. The imprint material 54 contains, for example, a radical polymerization acrylic resin. As shown in FIG. 4G, the mold 13 is then brought into contact with the imprint material 54 on the substrate. At this time, it is preferable to adjust the pressing force of the mold 13 with respect to the imprint material 54 so as to fill the pattern (indented structure) of the mold 13 with the imprint material 54 on the substrate. In addition, the irradiation unit 6 cures the imprint material 54 by irradiating the imprint material 54 with light while the imprint material 54 on the substrate is in contact with the mold 13. As shown in FIG. 4H, the pattern of the imprint material 54 which has a shape obtained by inverting the pattern (indented structure) of the mold 13 is formed on the substrate by separating the mold 13 from the cured imprint material 54 on the substrate.

As described above, in this embodiment, the removal film 53 for the removal of the foreign substance 50 is formed on the substrate W, and the removal film 53 is separated (removed) immediately before the imprint processing. Accordingly, the foreign substance 50 has been removed from the substrate before the imprint processing. Therefore, it is possible to suppress damage on the mold 13 and the substrate W as well as forming the pattern of the imprint material 54 in a desired shape.

The forming apparatus 20, the separating unit 3, and the processing unit 2 respectively perform the processing (steps S101, S102, and S103), the separation processing (step S104), and the imprint processing (step S105) in a chamber maintained at a cleanliness higher than that of a clean room. Accordingly, it is possible to reduce the possibility of making a foreign substance adhere to a substrate during these processes and suppress the adhesion of a foreign substance to the substrate W.

In this embodiment, although the imprint apparatus 1 has the function (the separating unit 3) of separating the removal film 53 formed on the substrate, the removal film 53 may be separated (removed) by another apparatus (a separating apparatus that separates the removal film 53) different from the imprint apparatus 1. In this case, in order to suppress the adhesion of another foreign substance to the substrate W after the separation of the removal film 53, the imprint apparatus 1 and the separating apparatus are preferably inline-connected through the substrate conveying unit.

In addition, the substrate stage 8 may be constituted by two stages, that is, a first stage and a second stage. The forming apparatus 20 and the imprint apparatus 1 may respectively use the first stage and the second stage. In this case, the forming apparatus 20 performs the processing of forming the organic film 51, the adjustment film 52, and the removal film 53 while the first stage is made to hold the substrate W. The separating unit 3 and the processing unit 2 respectively perform separation processing and imprint processing while the second stage is made to hold the substrate W.

Figure 5A:
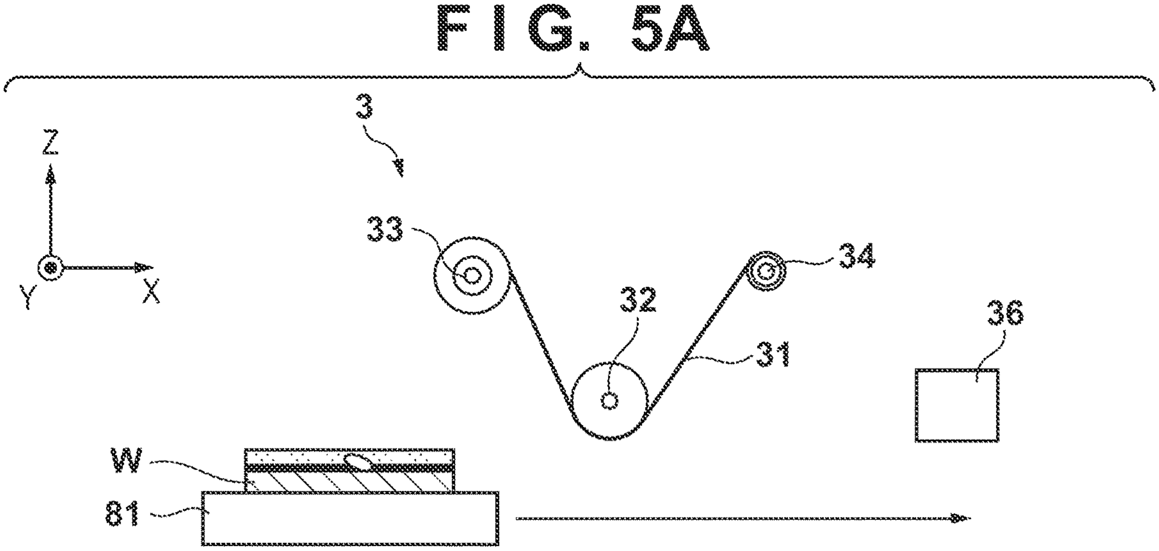
FIGS. 5A to 5C are views showing an example of the configurations of the separating unit of the imprint apparatus.
Figure 5B:
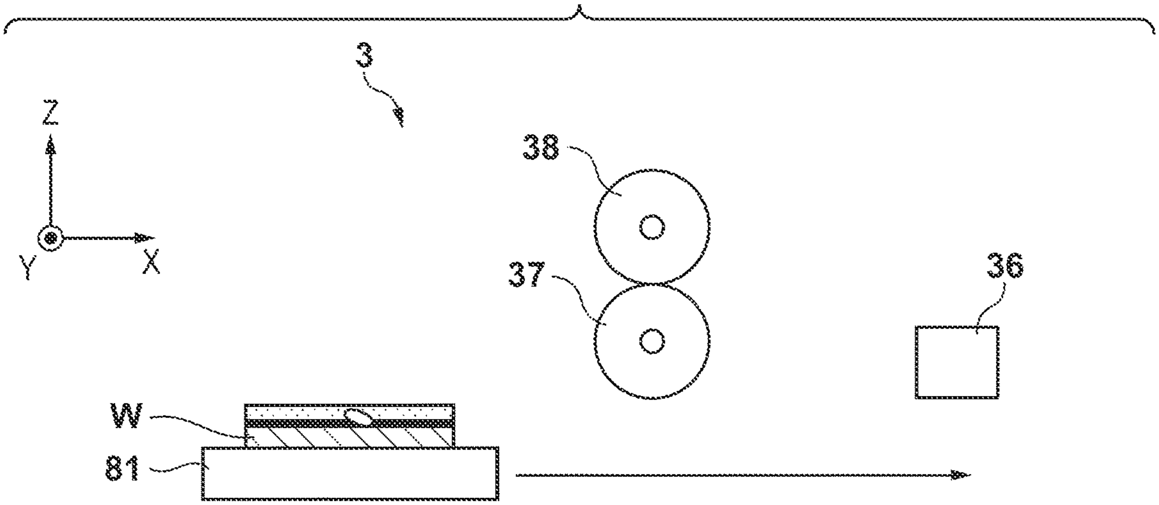
Figure 5C:
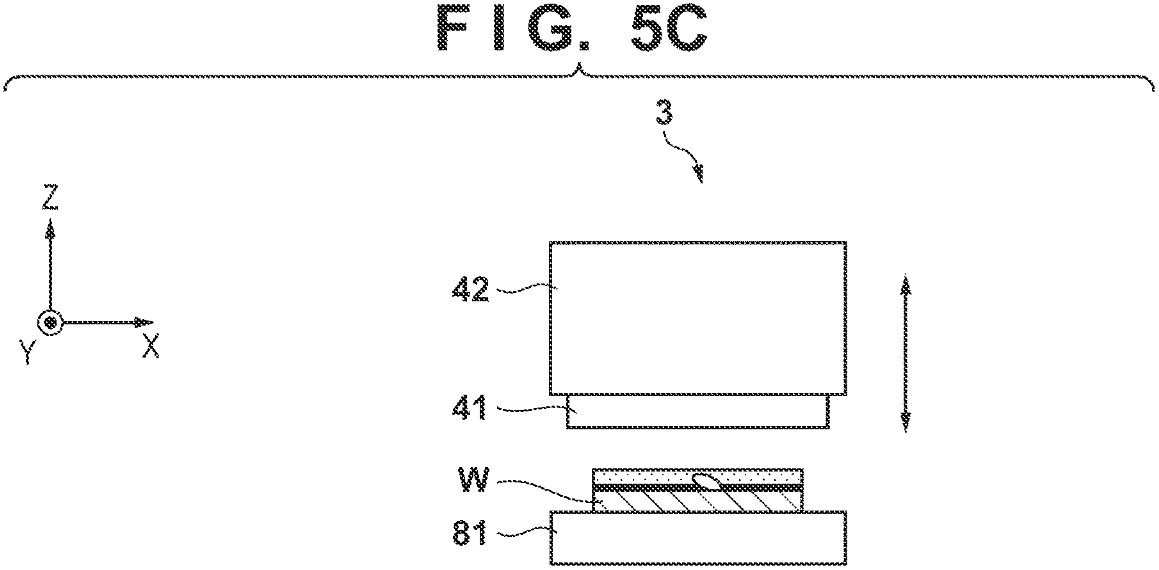

The detailed configurations of the separating unit 3 will be described below. As shown in FIGS. 5A, 5B, and 5C, the separating unit 3 has configurations capable of bringing a substance having adhesiveness into contact with the removal film 53 (its surface) formed on the substrate and separating the substance from the substrate W. FIGS. 5A, 5B, and 5C are views showing an example of the configurations of the separating unit 3.

For example, as shown in FIG. 5A, the separating unit 3 includes an adhesive tape 31, a pressure roller 32, a supply unit 33, a recovery unit 34, and an electrostatic remover 36. The separating unit 3 drives the substrate holding unit 81 holding the substrate W, on which the organic film 51, the adjustment film 52, and the removal film 53 are formed, in the X direction and conveys the substrate holding unit 81 to under the pressure roller 32. When the substrate holding unit 81 (the substrate W) is conveyed to under the pressure roller 32, the adhesive tape 31 adheres to the removal film 53 formed on the substrate. When the substrate holding unit 81 is further driven from under the pressure roller 32 in the X direction, the adhesive tape 31 adhering to the removal film 53 is recovered by the recovery unit 34 and separated from the substrate W. In this case, the removal film 53 formed on the substrate W is separated together with the adjustment film 52. The foreign substance 50 on the substrate is removed (recovered) by the adhesive tape 31 together with the adjustment film 52 and the removal film 53. The electrostatic remover 36 neutralizes the static electricity of the substrate W, that is, the organic film 51 (its surface) which is charged by separation of the adhesive tape 31.

Although FIG. 3 separately shows the separating unit 3 and the conveying unit 4, the separating unit 3 and the conveying unit 4 may be configured integrally. More specifically, the adhesive tape 31 may be separated from the substrate W during (in the process of) the conveyance of the substrate holding unit 81 holding the substrate W from the connecting apparatus 16 to the imprint apparatus 1 (processing unit 2).

In other configurations, as shown in FIG. 5B, the separating unit 3 includes a removal roller 37, an adhesive roller 38, and the electrostatic remover 36. The removal roller 37 has a function of adhering to the removal film 53 formed on the substrate like the adhesive tape 31 shown in FIG. 5A and removing (recovering) the foreign substance 50 on the substrate together with the adjustment film 52 and the removal film 53. The adhesive roller 38 recovers the adjustment film 52 and the removal film 53 (the foreign substance 50) adhering to the removal roller 37 by rotating in contact with the removal roller 37 in the opposite direction. This makes it possible to always maintain the removal roller 37 (its surface) in a clean state.

In other configurations, as shown in FIG. 5C, the separating unit 3 includes a separation template 41 and a template holding unit 42. The template holding unit 42 holds the separation template 41 having adhesiveness and brings the separation template 41 into contact with the removal film 53 formed on the substrate by driving the separation template 41 in a direction to approach the substrate W. In addition, the template holding unit 42 separates the removal film 53 together with the adjustment film 52 by driving the separation template 41 in contact with the removal film 53 in a direction to separate from the substrate W. This causes the separation template 41 to remove (recover) the foreign substance 50 on the substrate together with the adjustment film 52 and the removal film 53. Note that in order to increase the adhesive force between the separation template 41 and the removal film 53 formed on the substrate, the separation template 41 (its surface) may be processed in advance or may be coated with an adhesive material in advance. In addition, the adhesive force between the adhesive material applied to the separation template 41 and the removal film 53 may be increased by applying energy (light, heat, or the like) to the adhesive material while the adhesive material is in tight contact with the removal film 53.

The pattern of a cured product formed using the imprint system IS or the imprint apparatus 1 (the imprint method) according to the present embodiment is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 6A:
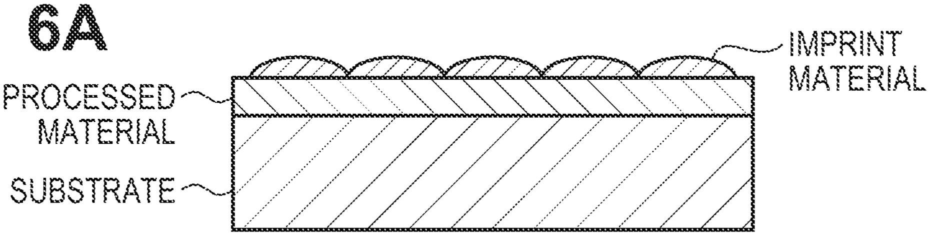
FIGS. 6A to 6F are views for describing an article manufacturing method.

Next, description regarding a detailed method of manufacturing an article is given. As illustrated in FIG. 6A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 6B:
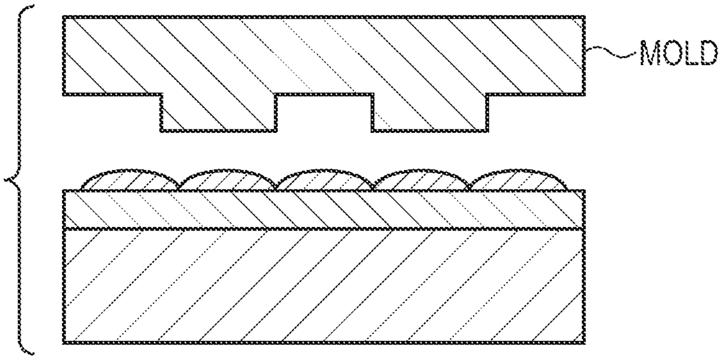
Figure 6C:
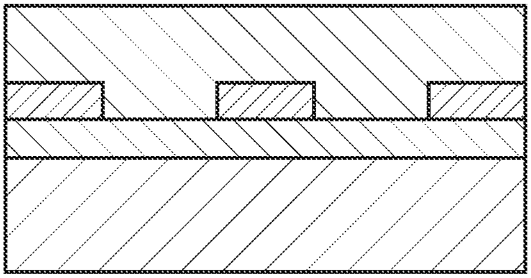

As shown in FIG. 6B, a side of the mold for imprint with a projection and groove pattern is formed on and caused to face the imprint material on the substrate. As illustrated in FIG. 6C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 6D:
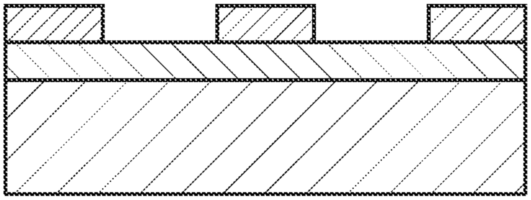

As shown in FIG. 6D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

Figure 6E:
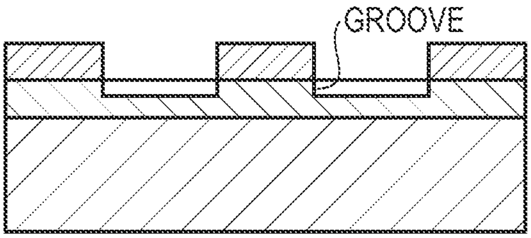
Figure 6F:
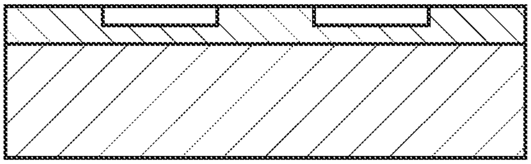

As shown in FIG. 6E, when etching is performed using the pattern of the cured product as an etching resistant mask, a portion of the surface of the processed material where the cured product does not exist or remains thin is removed to form a groove. As shown in FIG. 6F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2023-056354 filed on Mar. 30, 2023, which is hereby incorporated by reference herein in its entirety.

What is claimed is:

1. An imprint apparatus that performs, by using a mold, imprint processing of forming a pattern on an imprint material on a substrate, the apparatus comprising:

a substrate stage configured to hold the substrate;

a forming unit configured to perform processing of forming an organic film on a surface of the substrate, forming an adjustment film on the organic film, and forming a removal film on the adjustment film, wherein an adhesive force between the adjustment film and the organic film is smaller than the adhesive force between the adjustment film and the removal film;

a separating unit configured to perform separation processing of separating the removal film and the adjustment film from the substrate held on the substrate stage;

a processing unit including:

a dispenser configured to supply the imprint material on the organic film from which the removal film and the adjustment film have been separated; and a mechanism configured to adjust an interval between the mold and the substrate to which the imprint material is supplied, and configured to perform the imprint processing; and a chamber configured to accommodate the substrate stage, the separating unit, and the processing unit, wherein the separating unit and the processing unit respectively perform the separation processing and the imprint processing in the chamber.

2. The apparatus according to claim 1, wherein the removal film and the adjustment film are made of a thermosetting resin.

3. The apparatus according to claim 1, wherein the separating unit includes an adhesive tape and is configured to perform the separation processing by adhering the adhesive tape to the removal film and separating the adhesive tape adhered to the removal film.

4. The apparatus according to claim 1, wherein the separating unit includes a template having adhesiveness and is configured to perform the separation processing by bringing the template into contact with the removal film and separating the template in contact with the removal film.

5. The apparatus according to claim 1, wherein the substrate stage includes a first stage and a second stage, wherein the forming unit is configured to perform the processing while the substrate is held on the first stage, and wherein the separating unit and the processing unit are configured to respectively perform the separation processing and the imprint processing while the substrate is held on the second stage.

6. The apparatus according to claim 5, wherein the chamber accommodates the forming unit, and wherein the forming unit, the separating unit, and the processing unit are configured to respectively perform the processing, the separation processing, and the imprint processing in the chamber.

* * * * *